(12) United States Patent
Salomons et al.

(10) Patent No.: US 10,498,368 B2
(45) Date of Patent: Dec. 3, 2019

(54) DYNAMIC CLIENT-SIDE SELECTION OF FEC INFORMATION

(71) Applicant: MK SYSTEMS USA INC., Wilmington, DE (US)

(72) Inventors: Edwin Salomons, Dublin (IE); Alan Bishop, Campbell, CA (US)

(73) Assignee: MK Systems USA Inc., Wilmington, DE (US)

( * ) Notice: Subject to any disclaimer, the term of this patent is extended or adjusted under 35 U.S.C. 154(b) by 165 days.

(21) Appl. No.: 14/930,543

(22) Filed: Nov. 2, 2015

(65) Prior Publication Data

US 2017/0126256 A1  May 4, 2017

(51) Int. Cl.
| | | |
|---|---|---|
| H03M 13/35 | (2006.01) |
| H03M 13/00 | (2006.01) |
| H04L 29/06 | (2006.01) |
| H04L 1/00 | (2006.01) |
| H04N 21/2343 | (2011.01) |
| H04N 21/262 | (2011.01) |
| H04N 21/482 | (2011.01) |
| H04N 21/845 | (2011.01) |

(52) U.S. Cl.
CPC ..... *H03M 13/353* (2013.01); *H03M 13/6547* (2013.01); *H04L 1/0009* (2013.01); *H04L 1/0028* (2013.01); *H04L 65/4084* (2013.01); *H04L 65/602* (2013.01); *H04N 21/23439* (2013.01); *H04N 21/26258* (2013.01); *H04N 21/4825* (2013.01); *H04N 21/8456* (2013.01)

(58) Field of Classification Search
CPC .................................................. H03M 13/353
See application file for complete search history.

(56) References Cited

U.S. PATENT DOCUMENTS

| | | | |
|---|---|---|---|
| 6,910,175 B2* | 6/2005 | Krishnamachari | ... H03M 13/00 375/E7.279 |
| 6,917,614 B1 | 7/2005 | Laubach et al. | |
| 7,058,027 B1 | 6/2006 | Alessi et al. | |
| 7,451,381 B2* | 11/2008 | Miller | ....... H04L 1/08 714/774 |
| 8,683,066 B2* | 3/2014 | Hurst | ............... H04N 21/23439 375/240 |
| 8,745,650 B1* | 6/2014 | Bachman | ............... H04H 20/10 725/110 |
| 9,654,539 B2* | 5/2017 | Falvo | ..................... H04L 65/608 |
| 9,787,430 B2* | 10/2017 | Lee | ....................... H04L 1/0042 |
| 2004/0107284 A1 | 6/2004 | Koperda et al. | |
| 2007/0157064 A1* | 7/2007 | Falik | ................... G06F 11/1012 714/755 |

(Continued)

FOREIGN PATENT DOCUMENTS

WO    WO 00/16511 A1    3/2000

*Primary Examiner* — Steve B Nguyen
(74) *Attorney, Agent, or Firm* — Norton Rose Fulbright US LLP

(57) ABSTRACT

A client-side FEC selection system involves pre-generating FEC data for a plurality of media segment streams based on a number of FEC configuration settings at a server. Metadata relative to the FEC data may be provided to a client device via appropriate manifest files or other mechanisms, whereupon the client device is operative to select and request a suitable FEC data fragment responsive to monitoring various network characteristics.

7 Claims, 12 Drawing Sheets

(56) References Cited

U.S. PATENT DOCUMENTS

| | | | |
|---|---|---|---|
| 2012/0269110 A1* | 10/2012 | Walker | H04W 28/16 370/312 |
| 2013/0227122 A1* | 8/2013 | Gao | H04L 65/1083 709/224 |
| 2014/0101118 A1* | 4/2014 | Dhanapal | H04N 21/251 707/695 |
| 2015/0026358 A1* | 1/2015 | Zhang | H04L 65/601 709/231 |
| 2015/0067137 A1 | 3/2015 | VerSteeg et al. | |
| 2015/0270930 A1* | 9/2015 | Luby | H04L 1/0042 714/751 |
| 2016/0044078 A1* | 2/2016 | Hosur | H04L 67/02 709/219 |

* cited by examiner

US 10,498,368 B2

DYNAMIC CLIENT-SIDE SELECTION OF FEC INFORMATION

FIELD OF THE DISCLOSURE

The present disclosure generally relates to communication networks. More particularly, and not by way of any limitation, the present disclosure is directed to a system and method for effectuating dynamic client-side selection of forward error correction (FEC) information in an adaptive bitrate (ABR) streaming environment.

BACKGROUND

Adaptive bitrate (ABR) streaming of media has become a popular approach for delivering multimedia content over the Internet. Example streaming implementations use a "client-controlled" methodology in which the client requests media segments from a content server at an appropriate time, wherein data transfer typically takes place over HyperText Transfer Protocol (HTTP)-based networks utilizing reliable and/or unreliable transport mechanisms disposed between the media content sources and one or more clients. It should be appreciated that the infrastructure for HTTP-based streaming is far more widespread than that of other media streaming protocols such as Real-time Transport Protocol (RTP) and Real Time Streaming Protocol (RTSP).

Transmission of ABR media over unreliable transport can be problematic, however. Although techniques such as forward error correction or FEC are sometimes used to improve error resilience, e.g., in an Internet Protocol TV (IPTV) application, various shortcomings and deficiencies continue to persist.

SUMMARY

The present patent disclosure is broadly directed to systems, methods, apparatuses, as well as client devices and associated non-transitory computer-readable media for facilitating dynamic client-side selection of suitable FEC data in order to minimize transmission errors in an ABR network.

In one aspect, an embodiment a method operating at an ABR network node is disclosed. The claimed method comprises, inter alia, generating FEC data associated with each segment of one or more ABR representations of a media asset, wherein each of the one or more ABR representations comprises a stream of segmented content of the media asset encoded at a particular bitrate. The FEC data for each segment is generated on a per FEC configuration setting basis corresponding to each one of a plurality of FEC configuration settings provisioned at the ABR network node, wherein each setting is operative to apply a particular FEC mechanism or process with respect to the media asset. The claimed method further includes providing a manifest file associated with the media asset to an ABR client, wherein the manifest file contains metadata information relative to the media segments encoded at different bitrates as well as metadata information relative to the FEC data generated on a per FEC configuration setting basis for each media segment.

In a related aspect, an embodiment a method operating at an ABR streaming client is disclosed, wherein the claimed method comprises, inter alia, receiving a manifest file pursuant to streaming of a media asset from a media server. The received manifest file includes metadata information relative to one or more ABR representations of the media asset, each ABR representation comprising a stream of media segments encoded at a particular bitrate, and metadata information relative to FEC data associated with each segment of each ABR representation of the media asset. In one implementation, the FEC data is generated on a per FEC configuration setting basis for each one of a plurality of FEC configuration settings, each applying a particular FEC mechanism or process with respect to the media asset. The claimed method further includes monitoring a plurality of conditions relevant to the streaming of the media asset and applying a selection process, responsive to the monitored conditions, for identifying suitable bitrates of the ABR media segments and associated FEC data. Thereafter, at least one request may be generated for fetching the ABR media segments at identified bitrates and associated FEC data.

In another aspect, an ABR network node is disclosed, comprising, inter alia, one or more processors operative to control a media encoding and segmentation unit to facilitate encoding and segmentation of a media asset for generating one or more ABR representations of the media asset. The network node further includes one or more FEC encoders operating in association with the media encoding and segmentation unit for generating FEC data associated with each segment of one or more ABR representations of a media asset, wherein the FEC data for each segment is generated on a per FEC configuration setting basis corresponding to each one of a plurality of FEC configuration settings provisioned at the ABR network node. In one example implementation, each setting may be configured to apply a particular type or class of FEC mechanism or process effectuated by the one or more FEC encoders with respect to the media asset. A manifest generator may also be provided as part of the network node for operating in association with the media encoding and segmentation unit so as to provide a manifest file associated with streaming of the media asset to an ABR client, wherein the manifest file includes metadata information relative to the media segments encoded at different bitrates as well as metadata information relative to the FEC data generated on a per FEC configuration setting basis for each media segment.

In a still further aspect, an ABR streaming client equipment is disclosed, comprising, inter alia, one or more processors operative to control a metadata parser operative to parse metadata information in a manifest file received pursuant to streaming of a media asset from a media server. In one implementation, the received manifest file includes metadata information relative to one or more ABR representations of the media asset, wherein each ABR representation comprises a stream of media segments encoded at a particular bitrate, as well as metadata information relative to FEC data associated with each segment of each ABR representation of the media asset, the FEC data generated on a per FEC configuration setting basis for each one of a plurality of FEC configuration settings, each applying a particular FEC mechanism or process with respect to the media asset. A selection module operating in association with the one or more processors is provided for identifying suitable bitrates of the ABR media segments and associated FEC data responsive to monitoring a plurality of conditions relevant to the streaming of the media asset. An ABR streaming client module operating in association with the metadata parser and the selection module is configured for generating at least one request for fetching the ABR media segments at identified bitrates and associated FEC data.

In an example implementation, the selection module may be configured to operate in response to one or more of channel conditions, bandwidth consumption, network congestion, device playback and buffer playout conditions, bit error rates (BER) and shape/distribution of error patterns in respect of the media segment data, and the like.

In still further aspects, one or more embodiments of a non-transitory computer-readable medium containing computer-executable program instructions or code portions stored thereon are disclosed for performing one or more embodiments of the methods set forth herein when executed by a processor entity of a edge network node, an upstream network node, or a client device, and the like. Further features of the various embodiments are as claimed in the dependent claims appended hereto.

Benefits of the present invention include, but not limited to, providing an efficient and scalable FEC architecture at server side for proactively generating multiple FEC information blocks that a client may advantageously select from based on its channel monitoring. It should be appreciated that to be efficient, an FEC encoding scheme needs to be adapted to the real-time network characteristics, which can vary drastically among clients in a typical ABR network implementation. Such diversity of network characteristics results in a need to scale up the generation of FEC information to a large number of clients and adapt the server-side FEC process based on client feedback, which leads to further scalability issues because the cost and required processing power for FEC processing is linearly proportional to the number of clients in an ABR network. An embodiment of the present patent disclosure advantageously avoids such scalability issues by: (1) not requiring real-time client feedback about transmission channel characteristics, instead letting the client dynamically select the best FEC fragments based on measured channel characteristics; and (2) only requiring FEC fragments to be generated once per FEC configuration (thereby obviating the need to generate the FEC fragments on a per client basis with one dedicated generation process per client). Additionally, one skilled in the art will recognize that whereas a conventional FEC implementation involving a fixed FEC configuration is typically sub-optimal (due the inability to provide client-specific error correction capability), an embodiment disclosed herein allows for dynamic selection for FEC data by the client, thereby leading to higher error correction efficiency. Additional benefits and advantages of the embodiments will be apparent in view of the following description and accompanying Figures.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

Figure 1:
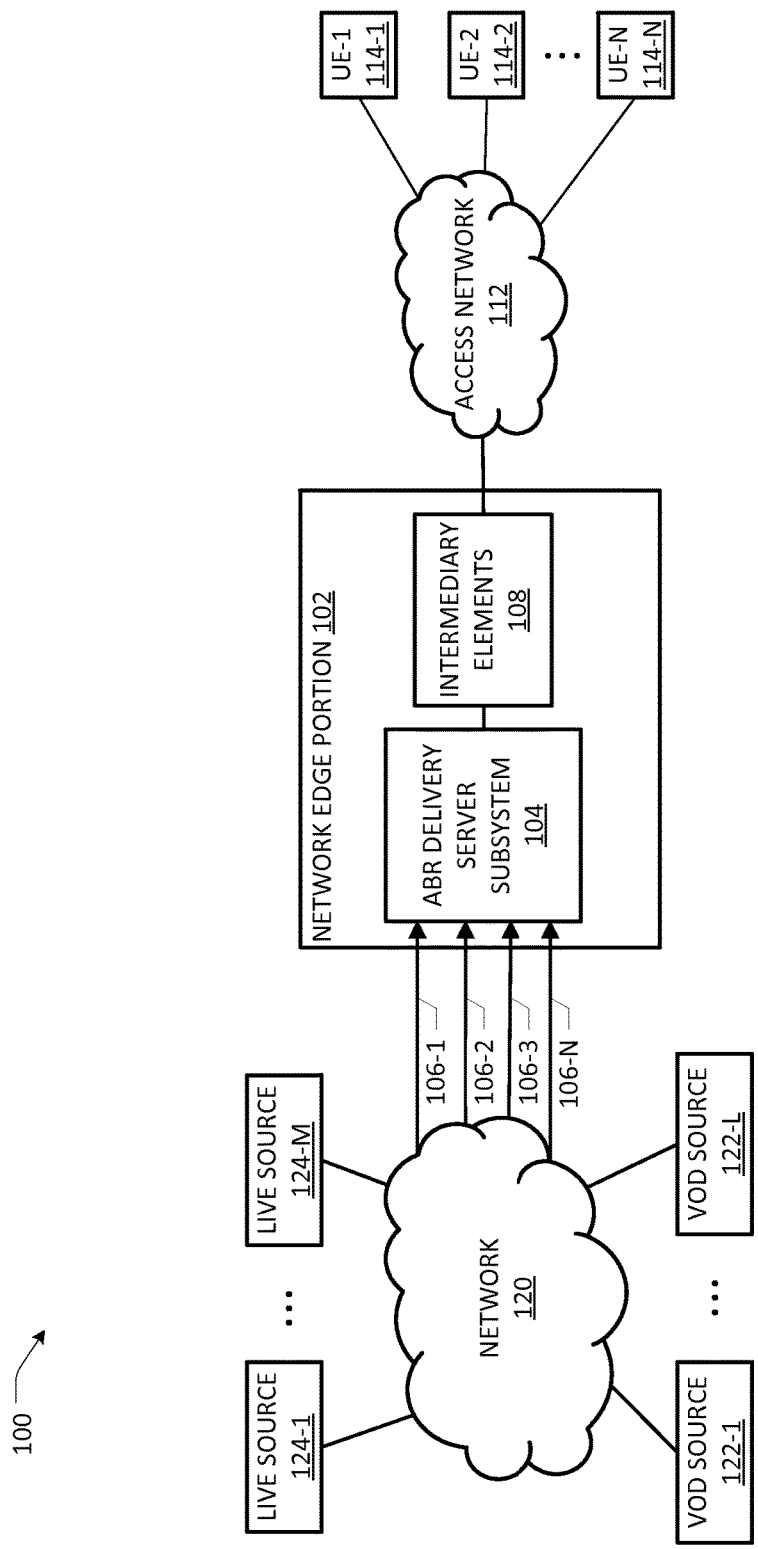
FIG. 1 depicts a generalized ABR network environment wherein one or more embodiments of the present invention may be practiced for facilitating client-side FEC selection responsive to various channel related conditions and other parametric data.

In the following description, numerous specific details are set forth with respect to one or more embodiments of the present patent disclosure. However, it should be understood that one or more embodiments may be practiced without such specific details. In other instances, well-known circuits, subsystems, components, structures and techniques have not been shown in detail in order not to obscure the understanding of the example embodiments. Accordingly, it will be appreciated by one skilled in the art that the embodiments of the present disclosure may be practiced without such specific components. It should be further recognized that those of ordinary skill in the art, with the aid of the Detailed Description set forth herein and taking reference to the accompanying drawings, will be able to make and use one or more embodiments without undue experimentation.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. Further, in one or more example embodiments set forth herein, generally speaking, an element, component or module may be configured to perform a function if the element is capable of performing or otherwise structurally arranged to perform that function.

As used herein, a network element or node may be comprised of one or more pieces of service network equipment, including hardware and software that communicatively interconnects other equipment on a network (e.g., other network elements, end stations, etc.), and is adapted to host one or more applications or services, either in a virtualized or non-virtualized environment, with respect to a plurality of subscribers and associated user equipment that are operative to receive/consume content in an adaptive bitrate (ABR) streaming network. As such, some network elements may be disposed in a wireless radio network environment whereas other network elements may be disposed in a public packet-switched network infrastructure, including or otherwise involving suitable content delivery network (CDN) infrastructure. Further, suitable network elements including one or more embodiments set forth herein may involve terrestrial and/or satellite broadband delivery infrastructures, e.g., a Digital Subscriber Line (DSL) architecture, a Data Over Cable Service Interface Specification (DOCSIS)-compliant Cable Modem Termination System (CMTS) architecture, a suitable satellite access network architecture or a broadband wireless access network architecture. Accordingly, some network elements may comprise "multiple services network elements" that provide support for multiple network-based functions (e.g., NV media delivery policy management, session control, QoS policy enforcement, bandwidth scheduling management, e.g., based on weighted fair queuing (WFQ), subscriber/device policy and profile management, content provider priority policy management, streaming policy management, and the like), in addition to providing support for multiple application services (e.g., data and multimedia applications). Example subscriber end stations or client devices may comprise ABR client devices and/or non-ABR client devices, which may include progressive download client devices, for instance, and may be referred to simply as "clients" for short in certain embodiments. Illustrative client devices may therefore include any device configured to execute, inter alia, a streaming client application for receiving and rendering content, live media and/or static/on-demand media, from one or more content providers, e.g., via a broadband access network, in accordance with one or more streaming protocols and technologies such as, e.g., Microsoft® Silverlight® Smooth Streaming, HTTP streaming (for instance, Dynamic Adaptive Streaming over HTTP or DASH, HTTP Live Streaming or HLS, HTTP Dynamic Streaming or HDS, etc.), Icecast, and so on. Accordingly, such client devices may include set-top boxes (STBs), networked TVs, personal/digital video recorders (PVR/DVRs), networked media projectors, portable laptops, netbooks, palm tops, tablets, smartphones, multimedia/video phones, mobile/wireless user equipment, portable media players, portable gaming systems or consoles (such as the Wii®, Play Station 3®, etc.) and the like, which may access or consume content/services provided via a suitable high speed broadband connection for purposes of one or more embodiments set forth herein.

One or more embodiments of the present patent disclosure may be implemented using different combinations of software, firmware, and/or hardware. Thus, one or more of the techniques shown in the Figures (e.g., flowcharts) may be implemented using code and data stored and executed on one or more electronic devices or nodes (e.g., a subscriber client device or end station, a network element, etc.). Such electronic devices may store and communicate (internally and/or with other electronic devices over a network) code and data using computer-readable media, such as non-transitory computer-readable storage media (e.g., magnetic disks, optical disks, random access memory, read-only memory, flash memory devices, phase-change memory, etc.), transitory computer-readable transmission media (e.g., electrical, optical, acoustical or other form of propagated signals—such as carrier waves, infrared signals, digital signals), etc. In addition, such network elements may typically include a set of one or more processors coupled to one or more other components, such as one or more storage devices (e.g., non-transitory machine-readable storage media) as well as storage database(s), user input/output devices (e.g., a keyboard, a touch screen, a pointing device, and/or a display), and network connections for effectuating signaling and/or bearer media transmission. The coupling of the set of processors and other components may be typically through one or more buses and bridges (also termed as bus controllers), arranged in any known (e.g., symmetric/shared multiprocessing) or heretofore unknown architectures. Thus, the storage device or component of a given electronic device or network element may be configured to store code and/or data for execution on one or more processors of that element, node or electronic device for purposes of implementing one or more techniques of the present disclosure.

Referring now to the drawings and more particularly to FIG. 1, depicted therein is a generalized ABR streaming network environment 100 wherein one or more embodiments of the present invention may be practiced for facilitating client-side forward error correction (FEC) with respect to delivering a media asset to a client device, over at least a portion of a network comprising unreliable transport links, responsive to various channel related conditions and other information, inter alia. It will be realized that one or more embodiments set forth herein may be advantageously practiced in combination with bandwidth management techniques, delivery optimization methodologies, etc., for example, responsive to a client's video buffer characteristics, client device/display characteristics and configurations, network/connection conditions, and the like, although it is not necessary that all such features be included in a particular embodiment. In general, the terms "media content," "media asset" or "content file" (or, simply "content") as used in reference to at least some embodiments of the present patent disclosure may include digital assets or program assets such as any type of audio/video (A/V) content that may comprise live capture media or static/stored on-demand media, e.g., over-the-air free network television (TV) shows or programs, pay TV broadcast programs via cable networks or satellite networks, free-to-air satellite TV shows, IPTV programs, Over-The-Top (OTT) and Video-On-Demand (VOD) or Movie-On-Demand (MOD) shows or programs, time-shifted TV (TSTV) content, etc. By way of illustration, a plurality of live content sources 124-1 to 124-M and a plurality of static/on-demand content sources 122-1 to 122-L are shown in the streaming environment 100 that exemplify various such content sources, from which content or media assets may be transmitted via a network 120 (e.g., an IP network using one or more transport layer protocols such as UDP or TCP in conjunction with an application layer protocol such as HTTP or other protocols) as segmented content streams that are encoded or transcoded at different bitrates (i.e., representations), to an edge network portion 102 (also sometimes referred to as "network edge") serving a plurality of UE devices 114-1 to 114-N via or in association with an access network 112. For example, reference numerals 106-1 to 106-N refer to a plurality of media streams (including ABR segmented VOD streams as well as ABR segmented live media streams, for instance) transmitted from such plurality of content sources. Appropriate manifest files containing metadata information describing the multiple bitrates used for encoding content at different resolutions and location pointers (e.g., Uniform Resource Locator (URL) pointers, etc.) of various segments of encoded media content are also provided to the edge network infrastructure 102 comprising an ABR delivery server subsystem 104 for effectuating streaming sessions via the access network 112. In an example implementation, the access network 112 may be comprised of a DSL network architecture, a DOCSIS-compliant Cable Modem Termination System (CMTS) network architecture, a mobile telecommunications network architecture, a CDN architecture, a metro Ethernet architecture, and/or a Fiber to the X (home/curb/premises, etc., FTTX) architecture. Accordingly, suitable intermediate elements such as routers, access multiplexers, CMTS nodes, etc., collectively shown as elements 108, may be provided in association with the network edge 102 for coupling with the access network 112. In addition, appropriate metadata information regarding various FEC schemes or configurations used for implementing error correction of content data may also be provided to UE client devices in accordance with the teachings of the present application as will be set forth in detail below, which error schemes may be provided at different hierarchical levels of the network architecture in an illustrative implementation, e.g., super headend (SHE) nodes, regional headend (RHE) nodes, video hub office (VHO) nodes, etc., depending on where the content sources and associated ABR processing systems are disposed.

Although not specifically shown in FIG. 1, at least a sub-group of UE devices 114-1 to 114-N may be operative as tethered or untethered customer premises equipment (CPE) devices associated with a subscriber premises in one example implementation. Regardless of the type of access network 112 or whether a UE device is part of a subscriber premises, a served UE device is operative as an ABR streaming client that may include one or more suitable media players configured to interoperate with applicable streaming protocols and technologies.

Figure 2:
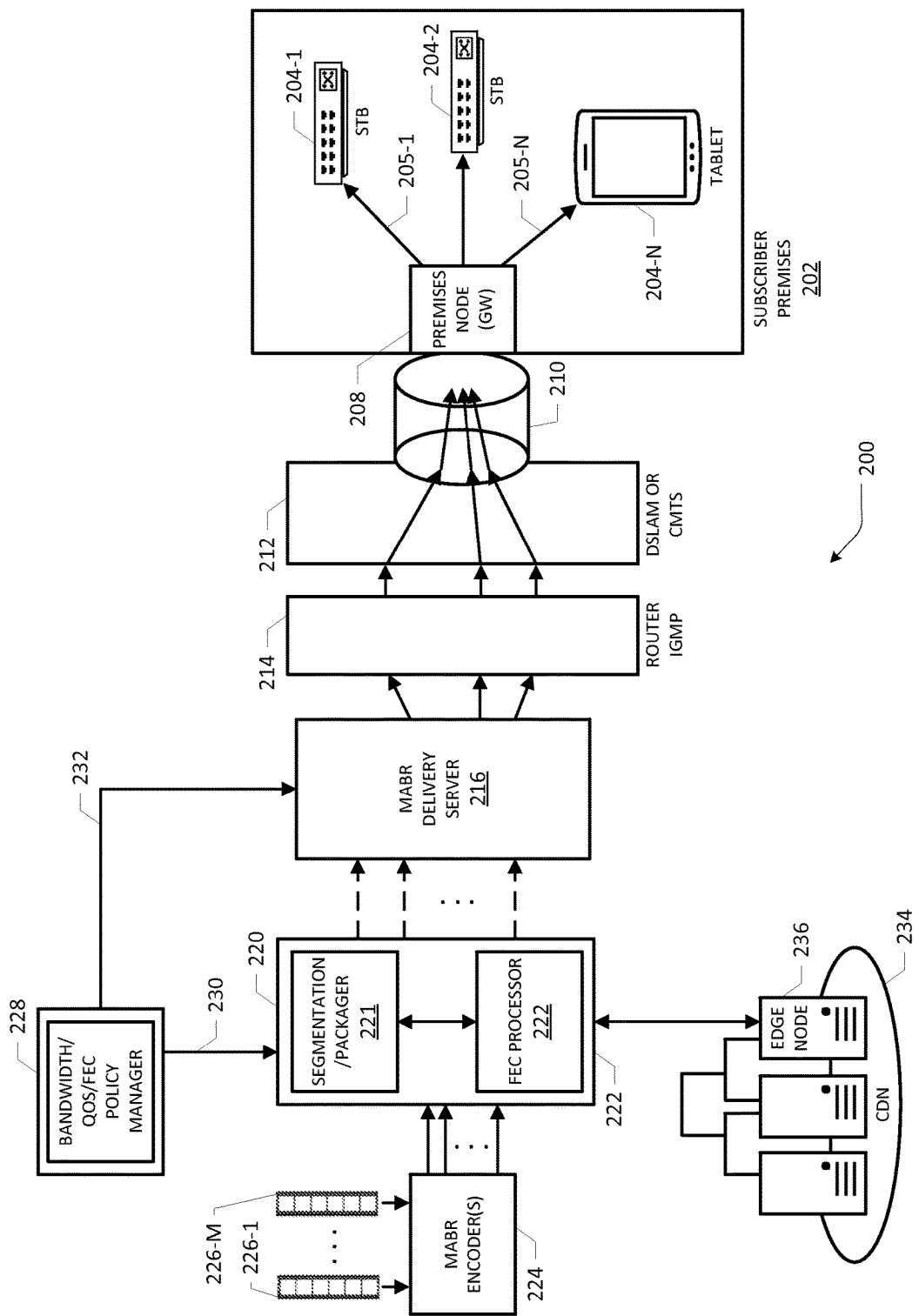
FIG. 2 depicts another aspect of an example ABR network environment with additional elements illustrated according to an embodiment of an IPTV application using multicast ABR.

FIG. 2 depicts another aspect of an example ABR network environment 200 with additional elements illustrated according to an embodiment using multicast ABR (MABR) architecture wherein a plurality of media asset channels may be provided in an IPTV application to UE client devices disposed in a subscriber premises 202. In the context of the present disclosure, the MABR communications network environment 200 may implemented as an end-to-end network architecture for delivering MABR media content (and advertisement content, where applicable) using any of the network delivery technologies described above. By way of example and introduction, MABR streaming delivery is broadly set forth herein that is applicable to both DSL and DOCSIS architectures without necessarily being limited thereto. As will be appreciated by one skilled in the art, content may be delivered using either multicast ABR techniques or unicast ABR techniques. In a unicast delivery, a subscribing receiver may be provided with a direct and unique two-way path through the delivery network all the way back to a serving media server supplying the required data stream. The main streaming activity is managed on a one-to-one basis between the receiver and the source server in a communication session. The network between the source server and receiver may typically comprise a series of intermediate servers installed at network nodes, which may not be directly involved in the service but only support the transfer of a packet stream. Typically, the protocols used to support the transmissions are simple forms of Internet Protocol (IP) itself augmented by one or more higher layer protocols to provide flow control. These protocols extend across the span of the network connection between the source server and a given receiver.

A unicast system can support ABR streaming, which allows some form of rate adaptation. A given service may be encoded at a selection of different bitrates (known as representations, as noted hereinabove), with synchronised boundary points at defined locations (e.g., every 50 frames). For each representation, content between successive boundary points is converted into a discrete file. Clients fetch a segment of one of the representations in turn. If a higher or a lower bit rate is required, the next segment is fetched from one of the other representations. The segments are constructed such that there is no discontinuity in decoded pictures/audio if the client switches between representations at the boundary points. This system may require a unicast two-way path between source and receiver to request files and deliver the requested files.

Multicast delivery makes more efficient use of bandwidth by sharing content streams among several receivers. Intermediate network elements (e.g., routers or switches) are now more closely involved in the service delivery such that some control and management functions are delegated from the source server. This control is supported by more extensive protocols devised for this type of application such as, e.g., Protocol Independent Multicast (PIM) and Internet Group Multicast Protocol (IGMP). When a receiver requests a given media item or asset, the network router system finds an existing stream of that content already in the network and directs a copy of it to that receiver from a serving cable headend, a video head office or an appropriately proximal network node in an edge distribution network. The requesting receiver may be provided with the capability to join this existing stream under controlled conditions that do not adversely affect existing receivers. Any receiver in this group may also be provided with the ability to leave the stream, or pause its consumption, without affecting the others. Additionally, there may be an implementation where a video pipe delivering services to a premises is operative to deliver content to one or more progressive download clients of the premises that are designed to receive the video in bursts.

Subscriber premises 202, which is served by a suitable broadband pipe 210, is illustratively shown as having a plurality of client devices or substations 204-1 to 204-N, e.g., laptops, STBs, smartphones, computers, gaming devices or consoles, OTT STBs, or tablets, etc., that may consume multicast content and effectuate FEC selection changes in accordance with an embodiment of the present patent application, wherein one or more STB stations may be respectively coupled to or otherwise integrated with at least one display device (not specifically shown). In general, UE devices 204-1 to 204-N may be configured to operate with one or more coder-decoder (codec) functionalities based on known or hereto unknown standards or specifications including but not limited to, e.g., Moving Pictures Expert Group (MPEG) codecs (MPEG, MPEG-2, MPEG-4, etc.), H.264 codec, High Efficiency Video Coding or HEVC (H.265) codec, and the like, in order to receive and render various programming content that is delivered as a plurality of service channels. A premises network (not explicitly shown), which may be implemented using any suitable wireless or wireline network technologies, may therefore comprise network paths or pipes 205-1 to 205-N for streaming service channel content to respective subscriber stations 204-1 to 204-N.

In an example implementation, subscriber premises 202 may be served via an access network architected over DSL infrastructure, DOCSIS-compliant CMTS infrastructure, and the like, as noted previously. Accordingly, the subscriber premises bandwidth pipe 210 may be disposed between subscriber premises 202 and an access node 212 such as a DSL Access Multiplexer (DSLAM) node or a CMTS node, wherein a suitable premises node or element 208 such as a DSL router/gateway or a cable modem is operative to effectuate communications (including bearer and signaling traffic) with respect to the client devices of the premises. A suitable IGMP switch or router 214 (e.g., IGMPv2/v3-capable Gigabit Ethernet (GigE) multicast router) is coupled to the access node 212 for effectuating suitable IGMP Leave/Join messages with respect to joining, leaving or changing various multicast streams corresponding to the service channels available to subscriber stations 204-1 to 204-N of the subscriber premises 202.

One or more ABR encoders 224, which may be provided as part of a multicast stream formation (MSF) functionality in one example embodiment, are operative to receive a plurality of channel source feeds 226-1 to 226-M corresponding to a group of service channels that may be provided as MABR channels having segmented streams at different bitrate representations. Typically, the ABR encoder 224 receives live feeds from appropriate communications networks, although it is possible in an alternative or additional arrangement for a file-based streamer to read the content files from a disk and stream the content streams via a network to the ABR encoder 224. Accordingly, the channel source feeds may comprise a variety of content or programs as noted previously. Further, VOD content may also be sourced via a CDN 234 and associated edge distribution node(s) 236 as part of service channels provided in an IPTV multicast ABR environment. Regardless of how channel source feeds are generated and provided in the example network environment 200, a server node or subsystem 220 comprising a segmentation and packaging (SAP) unit 221 and one or more FEC processors 222 configured to effectuate various FEC encoding mechanisms is operative to receive the content streams for suitable segmentation and error coding. As previously noted, each encoded MABR stream corresponds to a particular bitrate representation (e.g., 10 Mbs to 500 Kbs corresponding to various levels of video quality or resolutions) of a specific service channel or media asset channel to which a subscriber station may tune. Depending on implementation, the MBAR segment streams, with or without the FEC data, may be forward to an MABR service node 216 that provides particular channels to IGMP router 214 for joining and leaving as may be requested by the subscriber stations 204-1 to 204-N. Further, a bandwidth/QoS and FEC policy manager 228 may also be provided to generate suitable bandwidth and policy management signals to service nodes 220, 216 in order to configure appropriate levels of encoding bitrates and FEC schemas or settings on the server side. As can be appreciated, bitrate levels in an ABR scheme may be set through operator configuration in one implementation, e.g., tuned to the expected network conditions. Likewise, various a select set of FEC encoding schemes and settings may also be configured, preconfigured or reconfigured, e.g., dynamically or otherwise, for each MABR stream of each media asset channel based on, e.g., network conditions, bandwidth management policies, error correction policies, etc., as per suitable operator configuration settings.

Figure 3:
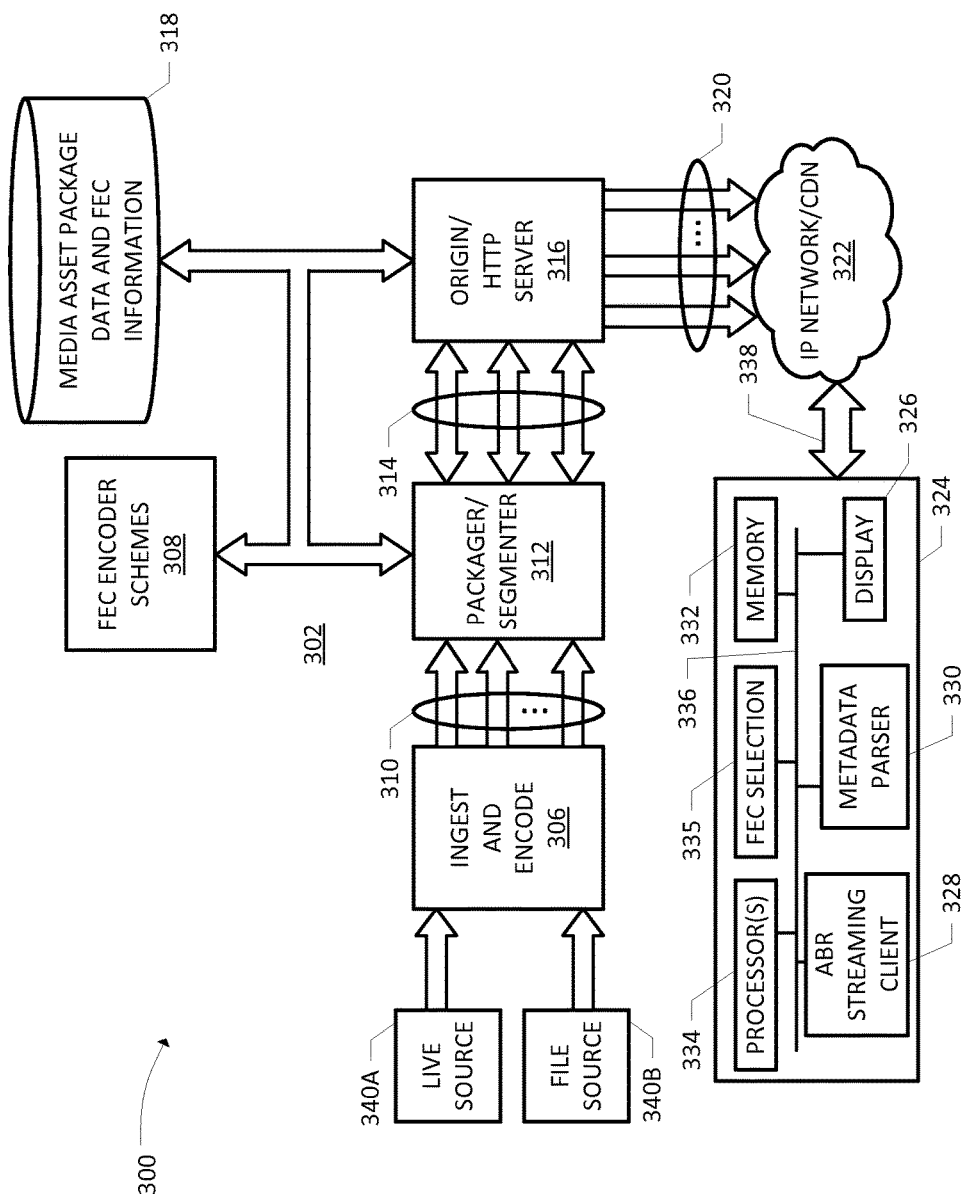
FIG. 3 depicts an example ABR segmentation/packaging server system having a plurality of FEC schemes for pre-generating FEC data with respect to multiple bitrate representations of media channels operative an ABR network environment according to an embodiment.

FIG. 3 depicts an example ABR segmentation/packaging server system having a plurality of FEC schemes for pre-generating FEC data with respect to multiple bitrate representations of media channels operative an ABR network environment 300 according to an embodiment. One skilled in the art will recognize upon reference hereto that the ABR network environment 300 is another aspect or variation of the network environments 100 and 200 shown in FIGS. 1 and 2, respectively, suitably modified to exemplify certain additional features of a server system 302 disposed in the ABR network environment 300. By way of illustration, the ABR network environment 300 may be configured to include an IP network and/or an overlay content delivery network or content distribution network (CDN) 322 coupled to the adaptive streaming server system 302. In one implementation, CDN 322 may comprise a delivery architecture over a public or private packet-switched network (e.g., the Internet) for facilitating high-performance streaming of a variety of media assets or program assets to an example ABR client device or UE device 324. It will be apparent that one or more such client devices may be associated with a subscriber/customer for consuming content delivered via CDN 322 in any type or number of access technologies including broadband access via wired and/or wireless (radio) communications, as noted previously, wherein the example UE device 324 is illustrative of any one of the subscriber stations or devices UE-1 114-1 to UE-N 114-N and/or subscriber premises devices 204-1 to 204-N described above in reference to FIGS. 1 and 2, respectively. For purposes of the present patent application, the terms "streaming client device" and "client device" may be used synonymously and may comprise any UE device or appliance that in one implementation not only receives program assets for live viewing, playback and/or decoding the content, but also operates as a command console or terminal that can accept user inputs, messages, commands or requests to interact with a network element disposed in IP/CDN 322 and/or associated streaming server systems for controlling transmission of content via a bidirectional interface. As an example, client device 324 may include one or more streaming client modules 328 (e.g., an HLS streaming client, a DASH client, etc.) and associated decoding functionalities depending on the streaming technologies implemented (e.g., HLS, MPEG-DASH, etc.) as well as a metadata parser module 330 operative to parse metadata information (e.g., relating to the encoded media segments and/or associated FEC data) received via a communication interface 338 to the IP/CDN 322.

It should be appreciated that FEC data or information for purposes of the present invention comprises channel coding data used for controlling or reducing errors in the media segment transmission over unreliable or noisy communication channels (e.g., including the last mile links), based on the principle that a sender system or node encodes the media data (e.g., ABR-encoded and segmented media channel data) in a redundant manner by using an error-correcting code (ECC) generation process according a number of known or heretofore unknown techniques or schemes. The redundancy data (which may also be referred to in the present patent application as "FEC data", "FEC information", "FEC blocks" or "FEC fragments", and terms of similar import), allows the receiving node, device or endpoint to detect a limited number of errors that may be present in the received media segment, and potentially correct such errors without requiring retransmission. In one implementation, FEC may be accomplished by adding redundancy data to the transmitted media segment data (referred to as "in-stream FEC implementation"). In another implementation, the redundancy data may be provided separately from the media segment data (referred to as "out-of-stream FEC implementation"). The redundancy data (e.g., comprising a certain number of bits) may be derived as a result of application of techniques that may be broadly classified into block coding techniques (e.g., that work on fixed-size blocks of data) or convolution coding techniques (e.g., that work on data streams of arbitrary length). Examples of FEC encoding techniques may comprise Reed-Solomon (RS) codes, Golay codes, Hamming codes, BCH codes, turbo codes, multi-parity codes, and the like. Furthermore, some of FEC encoding techniques may be systematic, i.e., the media segment data is not modified by the FEC coding, while the other techniques may be non-systematic, i.e., the media segment data is modified in the output by the FEC coding.

Streaming client module(s) 328 and the metadata parser module(s) 330 are operably coupled to one or more processors 334 and memory module(s) 332 via a suitable bus structure 336 for effectuating acquisition, decoding and rendering of the streamed media content, e.g., at a display 326. Although not specifically labeled, memory 332 is illustrative at least of a video buffer memory as well as one or more persistent memory modules containing program instructions for execution by the processors 334 in order to provide for the overall control of the UE operations. Additionally, an FEC selection module 335 is provided for effectuating one or more client-controlled FEC selection processes based on a number of channel conditions, and other heuristics, which module 335 may be configured to interoperate with other modules of the ABR client/UE device 324 under processor control as will be set forth in additional detail further below. An example implementation of the ABR client/UE device 324 may also include appropriate user interfaces for viewing one or more electronic program guides that list, identify or otherwise show various streaming channels (live media and/or on-demand) the subscriber is able to receive. Such user interfaces may also be configured to allow the user to scroll through an electronic program guide (i.e., channel surfing), select or otherwise change a particular streaming channel, and the like.

Continuing to refer to FIG. 3, the example adaptive streaming server system 302 may be configured to accept media content from live sources 304A and static file sources 304B at an ingest/encode block 306 that may employ a variety of source video codecs (e.g., H.264, MPEG varieties, High Efficiency Video Coding or HEVC (H.265), and the like). Where an input media stream is already encoded or compressed, block 306 may be configured to operate as a transcoder so that one or more ABR representations of the media content at suitable bitrates may be generated. In general operation, the example streaming server system 302 may be configured, under the control of one or more processors executing appropriate program code stored in a persistent memory module (not specifically shown), to effectuate adaptive streaming of content as follows. Initially, source media content is transcoded or otherwise encoded with different bit rates (e.g., multi-rate transcoding) using applicable encoder(s) 306. For example, content of a particular media asset may be transcoded into five video files using variable bit rates (or, synonymously "bitrates" or "representations", as referenced elsewhere in the present patent application), ranging from low to high bit rates (500 Kbps to 10 Mbps, by way of illustration). The particular content is therefore encoded as five different "versions" or "formats", wherein each bitrate is called a profile or representation. Reference numeral 310 refers to a collection of media streams encoded at different bitrates by the encoder 306. A segmentation/packager 312 is operative to divide each version of the encoded media content into fixed duration segments or chunks, which may be between two and ten seconds in duration, thereby generating a plurality of chunk streams 314. One skilled in the art will recognize that shorter segments may reduce coding efficiency whereas larger segments may impact the adaptability to changes in network throughput and/or fast changing client behavior. Furthermore, segment sizing may also impact FEC data computations, which may be effectuated by one or more FEC encoders 308 operative in association with the segmenter/packager block 312. Regardless of the chunk size, the segments may be Group-of-Pictures (GOP)-aligned such that all encoding profiles have the same media segment data with properly aligned timing boundaries. One or more suitable metadata files referred to as manifest files are created that describes the encoding rates and location pointers such as, e.g., URL pointers, relative to the various segments of encoded content. Additionally, where an out-of-stream FEC scheme is implemented, the manifest files may also include suitable location pointers with respect to the FEC fragment data that may be stored separately. Accordingly, the FEC encoder(s) 308 may be configured to operate at the encode/transcode level or at the segmentation/packaging level in order to generate appropriate FEC information depending on a particular embodiment. An origin/HTTP server 316 is operative to receive the encoded media streams 314, associated manifest files as well as the FEC information, which may be stored at one or more databases 318 for facilitating delivery of the media (including the FEC data appended thereto) as well as FEC fragments (where separately provided) to the requesting clients 324 via IP/CDN 320, illustrated as adaptive streams 220, which may be multicast in an arrangement such as the ABR network environment 200 set forth in FIG. 2.

In accordance with the teachings of the present invention, FEC encoders 308 are configured to pre-create or pre-generate a set of FEC information fragments for each of the AV media segments of a media asset, i.e., for each segment of each of the multiple ABR representations the media asset wherein each representation comprises a stream of media segments, on a per FEC configuration setting, which may be proactively provided or signaled to the clients to facilitate client-controlled selection of suitable FEC data. For example, if there are N FEC configuration settings provisioned at the server system, and a media asset is provided at M bitrate representations, a media segment of the media asset may be presented in [N×M] combinations. As noted previously, an example in-stream FEC implementation involves providing the N pieces of FEC data as part of the media segment at each of the M bitrate representations, e.g., appended therein, whereas the same N pieces of the FEC data for the M bitrate representations of the media segment may be warehoused at a different database from which they may be fetched via a separate request process (e.g., in an out-of-stream FEC implementation).

Figure 4:
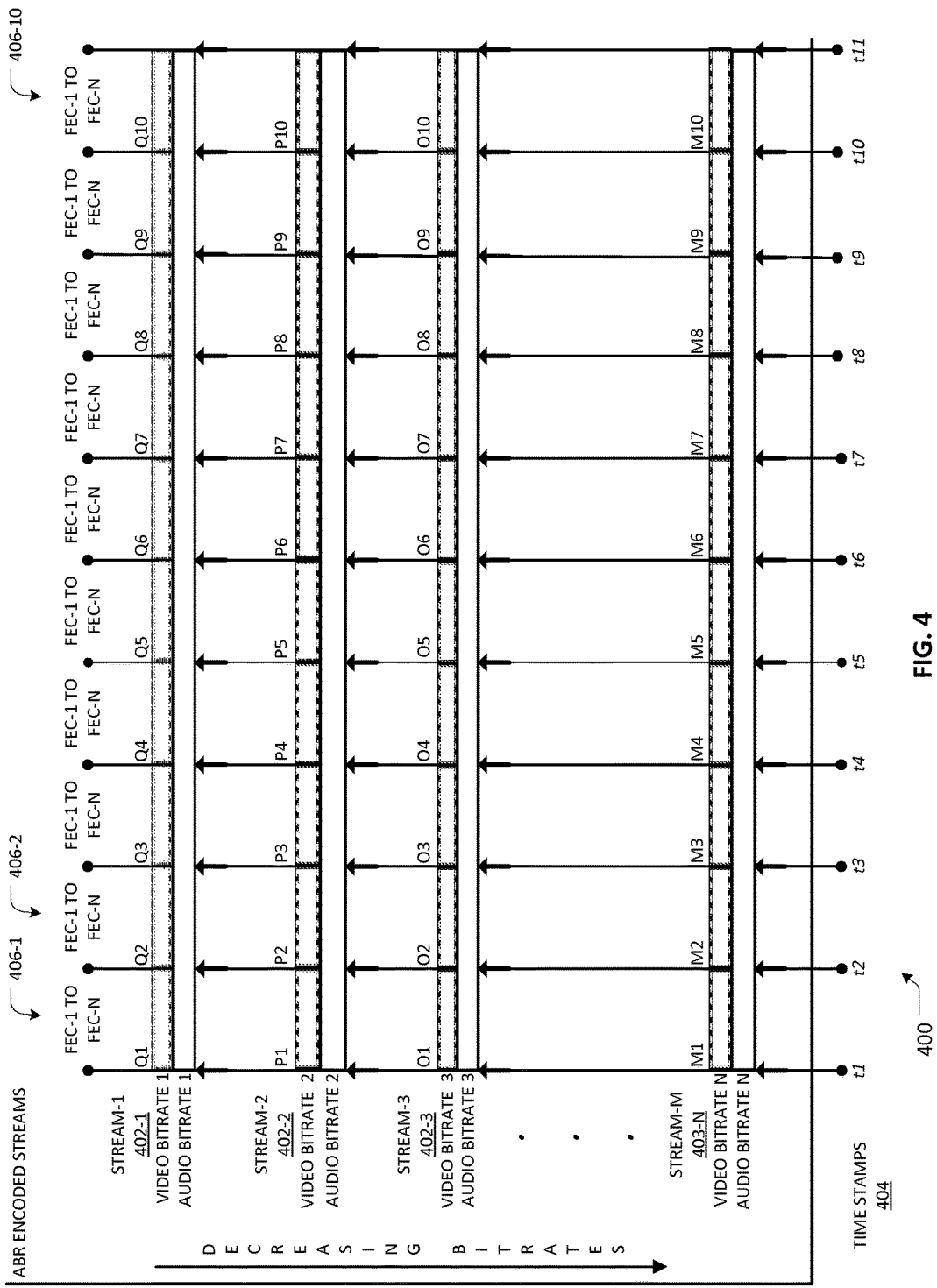
FIG. 4 depicts an embodiment of a media asset in multiple bitrate representations, each segment of each representation having FEC data obtained by a plurality of FEC schemes operative in an example ABR network.

FIG. 4 depicts an embodiment of a media asset in multiple bitrate representations, wherein each representation comprises a stream of segmented content of the media asset encoded at a particular bitrate, each segment of each representation having FEC data obtained by a plurality of FEC schemes operative in an example ABR network. Reference numeral 400 in FIG. 4 refers to a group of bit streams 402-1 to 402-M corresponding to a media asset, each encoded at specific video and audio bitrates, wherein FEC data obtained over a select duration of the video bit stream (e.g., a segment that may be a multiple of a number of stream access point (SAP) durations or other suitable timestamps) may be referenced in a suitable manifest file. Illustratively, timestamps t1 to t11 are shown in the encoded bit streams, thereby giving rise to ten FEC data values 406-1 to 406-10 for each bit stream and for each of N FEC settings. For stream-1 402-1, these values are illustratively shown as Q1-Q10 at a particular FEC setting for the different segments of the stream. In similar fashion, P1-P10 refer to the FEC values for stream-2 402-2; O1-O10 refer to the FEC values for stream-3 402-3; and M1-M10 refer to the FEC values for stream-M 402-M, at a particular setting of the N FEC settings.

Figure 5:
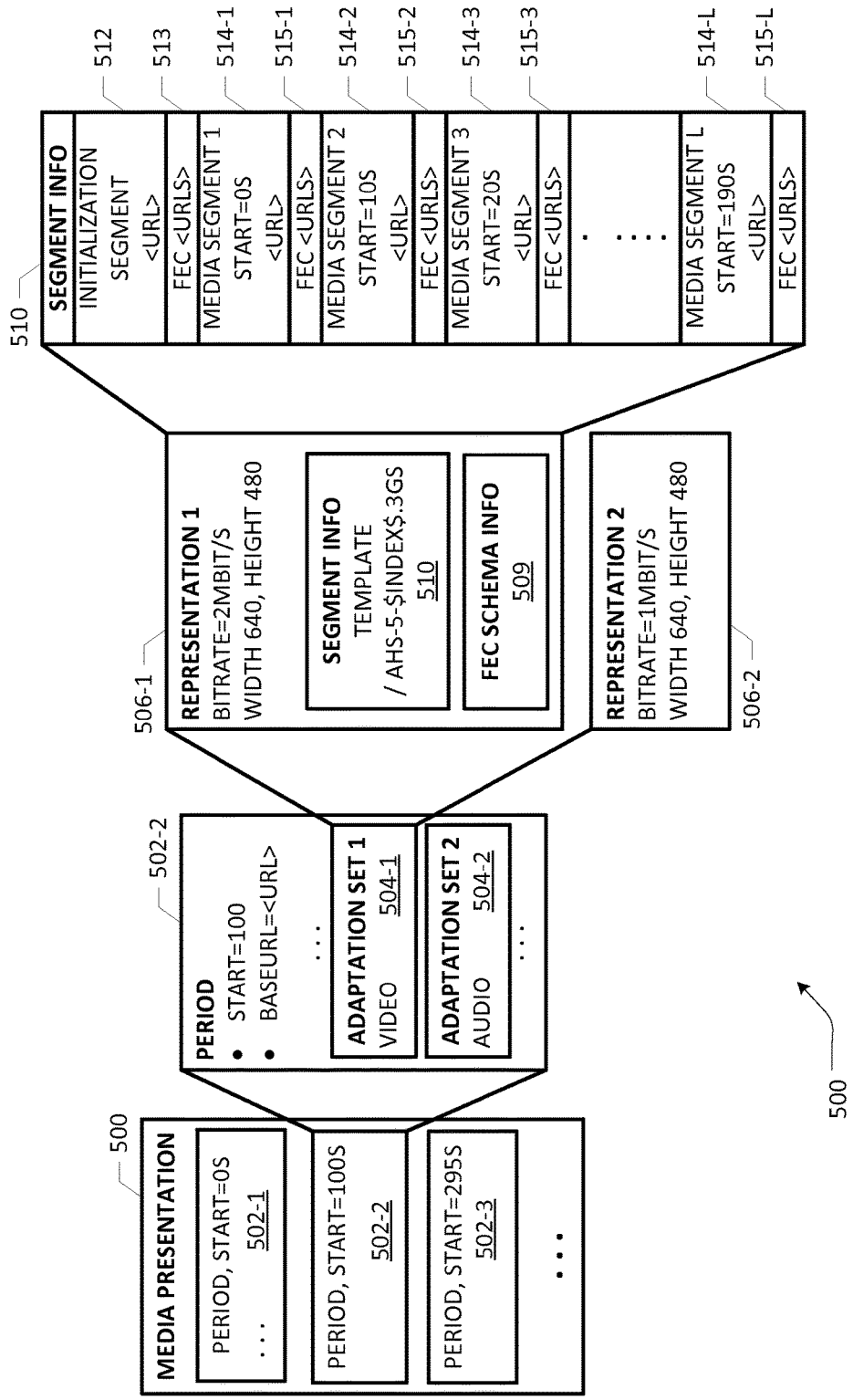
FIG. 5 depicts an example media presentation data structure associated with a segmented media asset in multiple bitrate representations according to an embodiment of the present patent disclosure.

FIG. 5 depicts an example manifest file, e.g., as a media presentation data (MPD) structure operative in an MPEG-DASH based streaming application, associated with a segmented media asset in multiple bitrate representations wherein FEC related metadata information may be provided according to an embodiment of the present patent disclosure. Reference numeral 500 refers to an example MPD data structure model that is illustrative of hierarchical organization of the metadata relative to different media segments of a particular content. In general, MPD 500 contains one or more periods, e.g., periods 502-1 to 502-3, that may be ordered in ascending chronological order (i.e., increasing in time) with a start time and associated time duration. Each period (e.g., period 502-2) includes one or one or more adaptation sets for different asset components, each adaptation set comprising one or more representations. Representations in the same adaptation set are alternatives to each other and typically contain different encoded versions of the same source media content and may include parameters such as language, media component type, picture aspect ratio, accessibility, etc. as well as information regarding the various FEC schemas or configuration settings used at the ABR media server system. As illustrated, reference numerals 504-1 and 504-2 respectively refer to a video adaptation set and an audio adaptation set of period 502-2. The video adaptation set 504-1 in turn includes two representations 506-1 and 506-2, each having respective bitrates, display resolutions, etc, in addition to the segment metadata information and FEC schema information (e.g., which may be provided as a catalog file for a representation) with respect to each representation, as exemplified by segment metadata information 510 and FEC schema information 509 associated with representation 506-1. By way of further hierarchical arrangement, example segment metadata information 510 includes an initialization segment 512 as well as media segment metadata portions 514-1 to 514-L, each segment metadata portion including URLs or other suitable location pointers to media segments as well as associated timing parameters. In an out-of-stream FEC implementation, an embodiment of the MPD model 500 may also include FEC fragment location information relative to the media segment metadata information, e.g., as illustrated by FEC URL(s) 513 that point to a plurality of FEC fragments relative to the initialization segment metadata portion 512 and FEC URL (s) 515-1 to 515-L corresponding to the locations of FEC fragments relative to the associated media segment metadata portions 514-1 to 514-L.

Figure 6:
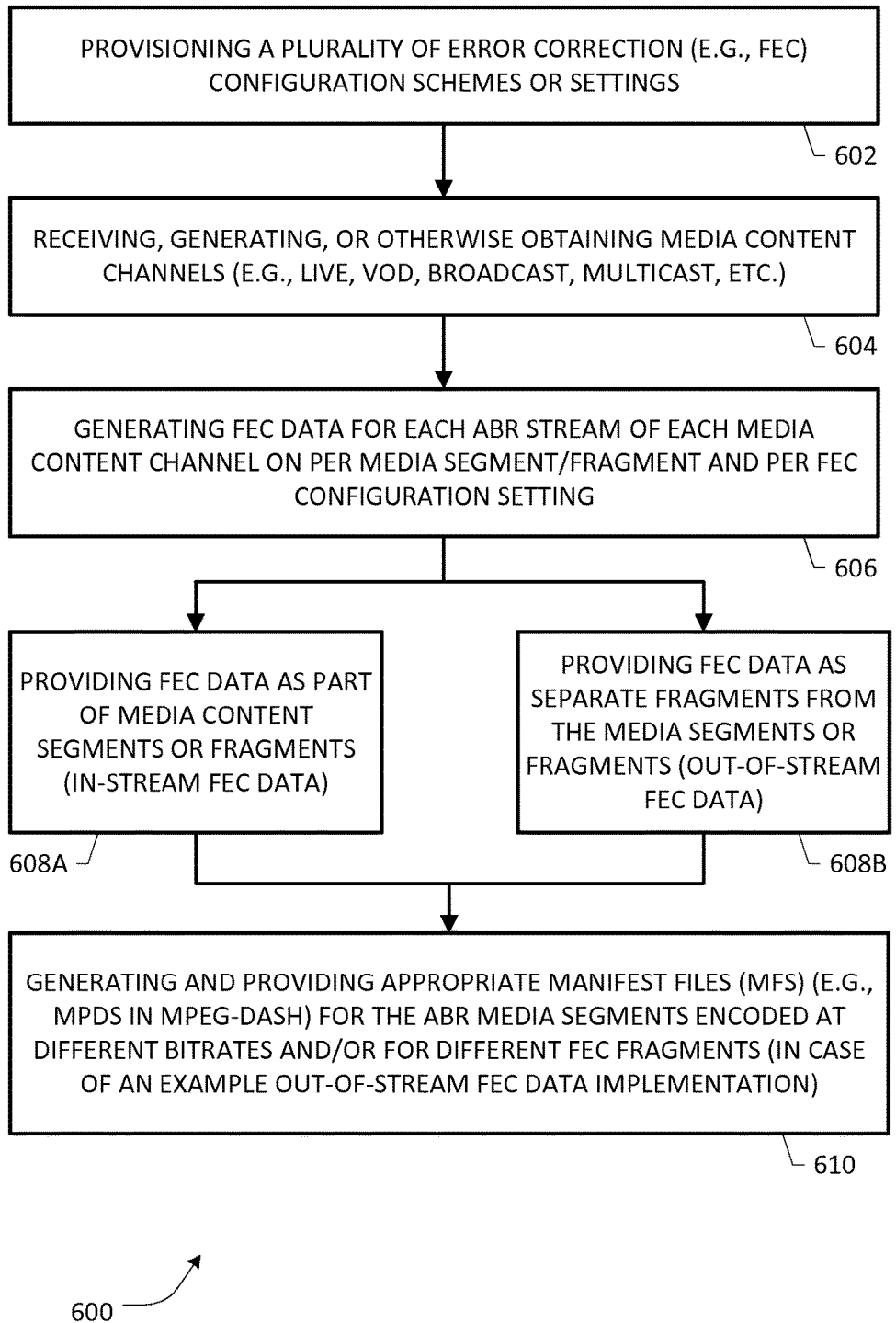
FIGS. 6 and 7 depict flowcharts of steps, acts, blocks and/or functions that may take place at a server system relative to an illustrative process for facilitating client-side FEC selection according to an example embodiment.

FIG. 6 depicts flowcharts of steps, acts, blocks and/or functions that may take place at a server system relative to an illustrative process 600 for facilitating client-side FEC selection according to an example embodiment. At block 602, a plurality of error correction configuration schemes or settings (e.g., by way of one or more FEC encoders, each setting being operative to apply a particular FEC mechanism), may be provisioned at an example server system (e.g., an MABR media server operative in an IPTV network). As noted previously, such FEC configuration settings may be provisioned based on operator configuration policies similar to selecting different levels of multi-bit ABR encoding. At block 604, various media content channels (e.g., live, VOD, broadcast, multicast, etc.) may be received, generated, or otherwise obtained, depending on the hierarchical level of a network architecture where the media is sourced. FEC data for each ABR stream of each media content channel on per media segment/fragment and per FEC configuration setting is pre-generated or generated (block 606). Depending on whether FEC data is provided in-stream or out-of-stream, metadata files are suitably constructed or provided, to the requesting clients as described previously, which steps are exemplified in blocks 608A, 608B and 610.

Figure 7:
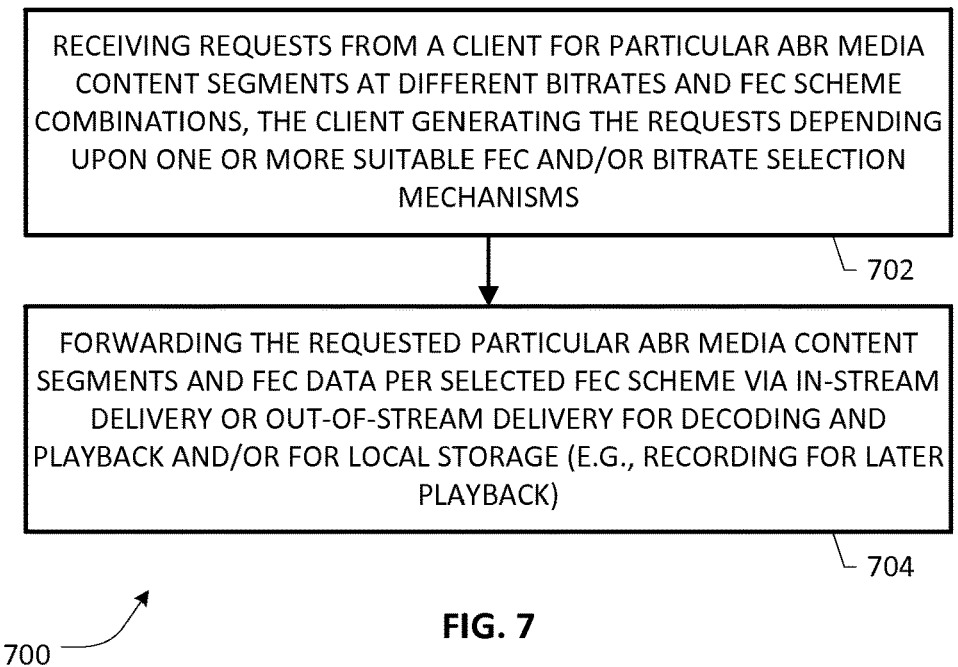

FIG. 7 depicts flowcharts of further steps, acts, blocks and/or functions that may take place at a server system relative to an illustrative process 700 pursuant to client-side FEC selection in an example embodiment. At block 702, a request from a client for particular ABR media content segments at one or more bitrates and FEC scheme combinations may be received, the client generating the requests depending upon one or more suitable FEC and/or bitrate selection mechanisms. Responsive thereto, the requested particular ABR media content segments and FEC data fragments per selected FEC scheme may be delivered to the client, via in-stream delivery or out-of-stream delivery for decoding and playback and/or for local storage (e.g., recording for later playback), as set forth at block 704.

Figure 8:
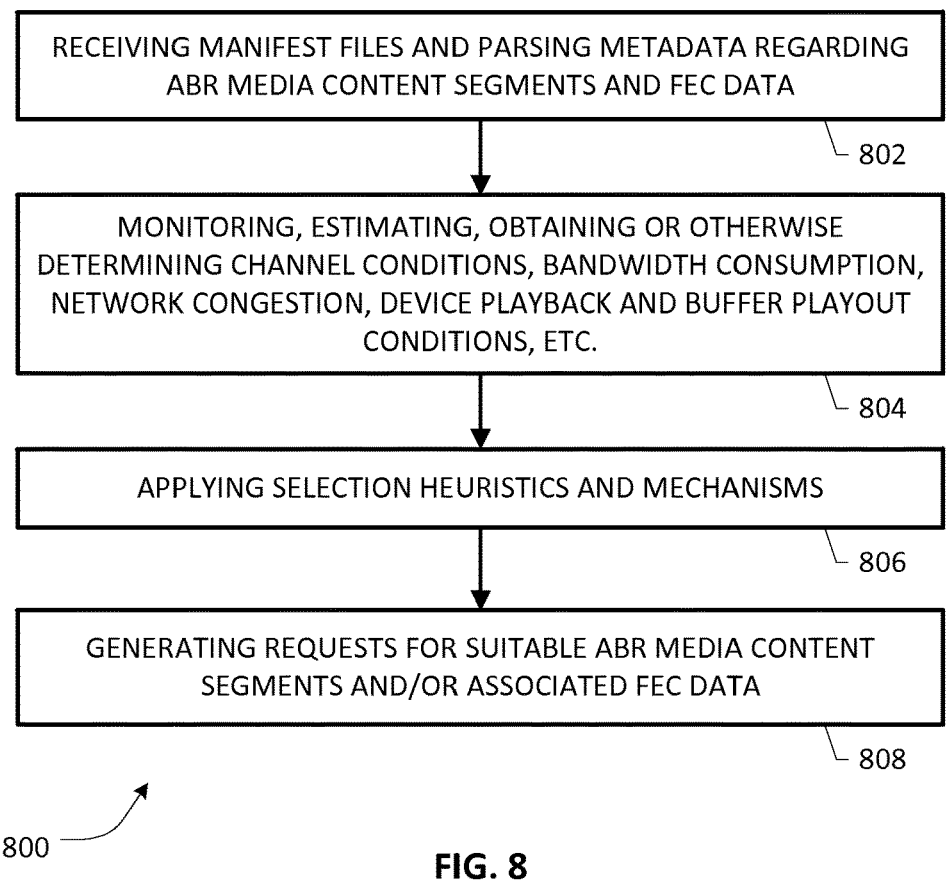
FIG. 8 depicts a flowchart of steps, acts, blocks and/or functions that may take place at a client node or at a gateway having FEC decoding and/or FEC selection functionality according to an example embodiment.

It should be noted that the functionality of FEC decoding and FEC selection may be provided at a gateway node serving a plurality of UE devices (e.g., such as a premises gateway shown in FIG. 2) or at a subscriber station itself. Regardless of where such functionalities are provided, an embodiment of the present invention is operative to monitor the transmission characteristics associated with downloading of a media asset, e.g., by using error detection on the received data, and determine an appropriate or optimal FEC scheme to correct the errors in a media segment. In one implementation, example error detection analysis may yield, determine, derive or otherwise obtain a measure of the expected real-time error statistics that may be provided as an input to a multivariate selection heuristics module for determining optimal FEC schemes or settings. FIG. 8 depicts a flowchart of steps, acts, blocks and/or functions that may take place at a client node or at a gateway having FEC decoding/selection functionality according to an example embodiment. At block 802, metadata regarding ABR media content segments and FEC data received in appropriate manifest files from the media server are parsed. At block 804, one or more processes are engaged, launched or instantiated for monitoring, estimating, obtaining or otherwise determining channel conditions, bandwidth consumption, network congestion, device playback and buffer playout conditions, bit error rates (BER), shape/distribution of error patterns, etc. In one example implementation, such processes may be augmented by network-side processes and the selection logic may accordingly receive additional inputs from other sources as well. Responsive to the monitoring and/or obtaining additional inputs, suitable selection heuristic mechanisms may be applied (block 806), that may be configured to identify and/or select suitable FEC schema/ settings determined to optimize streaming (e.g., minimize transmission errors), whereupon appropriate request messages may be generated to the media server database (in the case of in-stream FEC implementation). If a separate a FEC fragment database is provided (out-of-stream FEC implementation), separate request messages for the FEC fragments may be generated for retrieving or fetching the FEC fragments needed for reconstructing/recovering the corresponding media segments. It should therefore be appreciated that in an out-of-stream FEC implementation, a client device (or a gateway) may generate two separate requests, one for requesting the AV media segment(s) at a particular bitrate and the other for requesting the FEC data most optimal with respect to the AV media segments being requested. The foregoing operations are exemplified in block 808.

In a typical ABR streaming scenario, the data size of the FEC fragments can be significantly smaller than the data size of the original AB media segments or fragments. One skilled in the art will recognize upon reference hereto that clients can request the AV media fragments and FEC fragments at same time without waiting for error detection and retransmission to be completed, although it is not necessary in certain embodiments. Also, in an out-of-stream FEC implementation involving ABR media being downloaded for recording (e.g., the media being streamed for recording at a local or networked storage device in order to initiate a playback at a later time), for example, the FEC fragments may not be fetched at the time of streaming of media. Rather, while the ABR media segments are downloaded and stored at the record time, the FEC fragments may be downloaded only at playback time. Since the FEC fragment data is retrieved for correcting the errors in the recorded ABR media segments, only one FEC fragment (e.g., one determined to be suitable for optimal rendering) may be downloaded per media segment at the playback time.

Figure 9A:
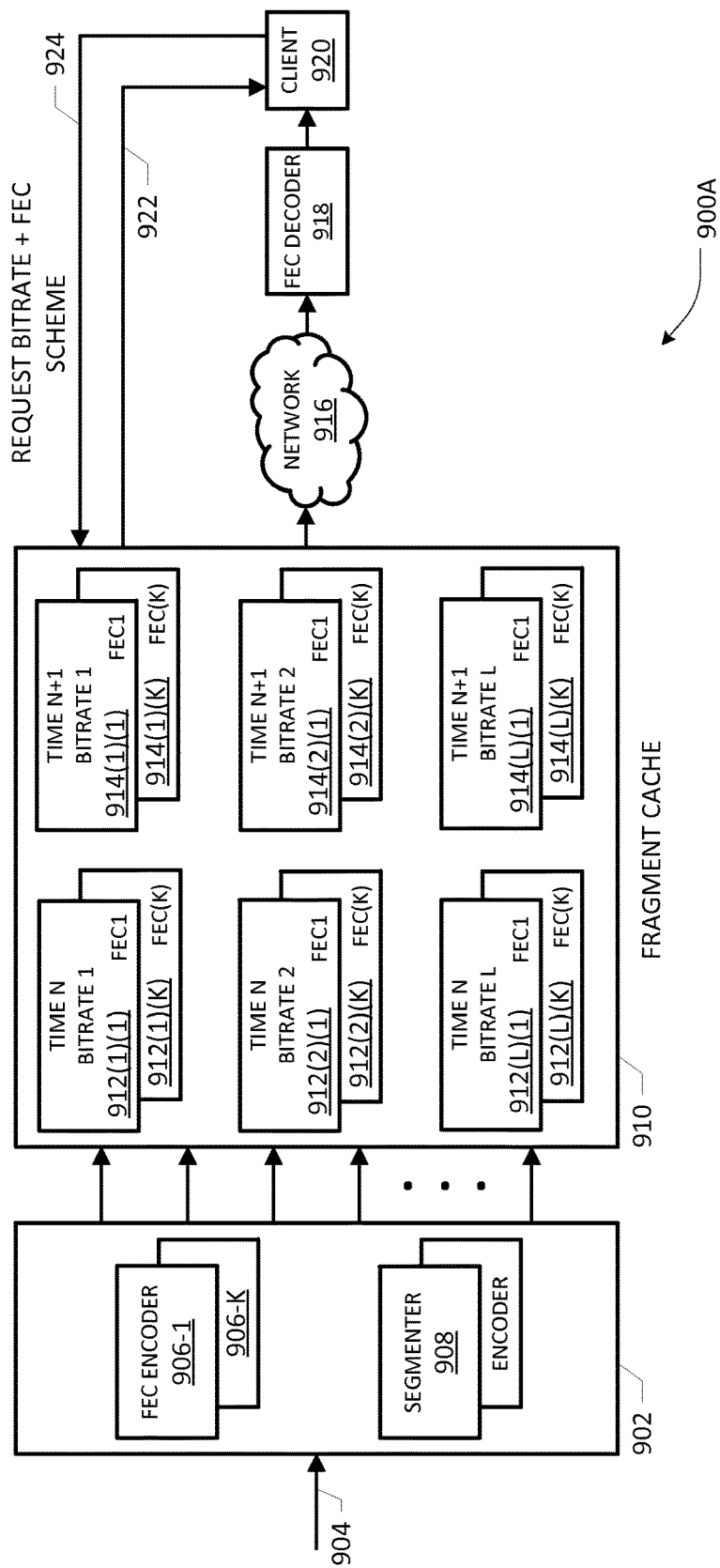
FIG. 9A depicts an ABR network architecture wherein FEC data or information blocks are provided along with media segment/fragment data according to an example embodiment.

Turning to FIG. 9A, depicted therein is an ABR network architecture 900A wherein FEC data or information blocks are provided along with media segment/fragment data according to an example embodiment. A media source 904 (which is illustrative of any of the media sources shown in FIGS. 1 to 3 described above) is provided to a server node 902 comprising a segmentation block 908 and one or more FEC encoders 906-1 to 906-K for effectuating the segmentation and encoding operations as described above. A plurality of bitrate representations (e.g., L representations) of the media are processed and FEC encoded for storage at a database or fragment cache 910 that may be associated with a suitable delivery node in an ABR network environment. Reference numerals 912(1)(1) to 912(L)(1) refer to media segments (at Time=N) with FEC information block data obtained from a first one the FEC settings (e.g., FEC 1) appended therein, each encoded at a particular bitrate of L bitrates. Reference numerals 912(1)(K) to 912(L)(K) likewise refer to media segments at Time=N with FEC information block data obtained from a last one of the preconfigured FEC settings (e.g., FEC-K) appended therein. In similar fashion, media segments for Time=(N+1) having different FEC information block data are shown at 914(1)(1) to 914(L)(1) and 914(1)(K) to 914(L)(K) in the cache 910.

Similar to the ABR network environments shown in FIGS. 1 to 3, a suitable network 916 is operative to facilitate streaming of the media segments to an FEC decoder functionality 918 and associated client node 912. As noted before, the FEC decoder functionality 918 may be provided at the client node 920 or at an upstream gateway node (not shown). Reference numeral 922 refers to a manifest file path (which may be different from the media delivery network 916) by which the client node 920 receives appropriate metadata information from the server node. Reference numeral 924 refers to a request message path from the client node 920 (which again may be separate from the media delivery network 916) operative to transmit a request for a select bitrate and FEC scheme combination as discussed previously.

Figure 9B:
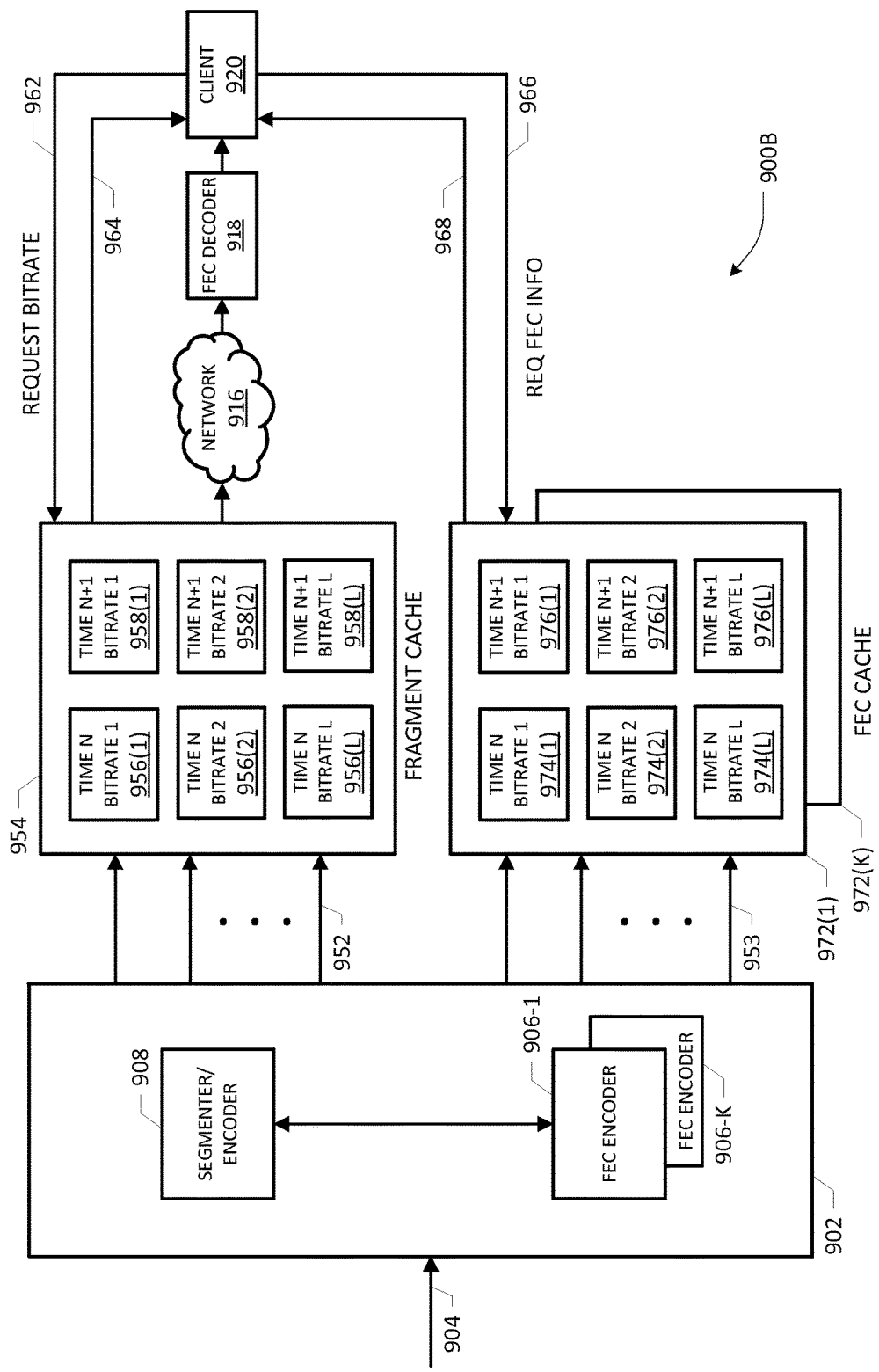
FIG. 9B depicts another ABR network architecture wherein media segment/fragment data and associated FEC data or information blocks are provided as separate databases according to an example embodiment.

FIG. 9B depicts another ABR network architecture 900B wherein media segment/fragment data and associated FEC data or information blocks are provided as separate databases 954, 972, respectively, according to an example embodiment. Similar to the arrangement shown in FIG. 9A, source media 904 is processed by the server node 902 to generate a plurality of media segment streams 952 at different bitrates to the media fragment cache 954. Corresponding FEC fragments may be provided as a plurality of FEC block streams 953, on a segment by segment basis, to the FEC fragment cache 972(1) to 972(K) (corresponding to the K FEC encode settings), which may or may not be co-located with the media fragment cache 954. As before, the delivery network 916 is operative to facilitate media delivery to the client node 920, which may be configured in one example implementation to receive the media and FEC metadata information via two separate paths 964 and 968, respectively. Corresponding request paths, bitrate request path 962 and FEC information request path 966, disposed from the client node 920 are operative for sending out appropriate request messages with select bitrate(s) of media segments and FEC blocks associated therewith.

It should be appreciated that the FEC block data may be shared between several client nodes with similar FEC configuration requirements. Accordingly, efficient delivery of FEC blocks may be achieved by using edge caching similar to the techniques used in a conventional CDN. In an alternative arrangement, the FEC fragments may be transmitted via multicast on a separate stream (e.g., different from the AV media multicast stream), wherein the client is adapted to select the most optimal multicast stream for the FEC information based on error detection statistics.

Figure 10:
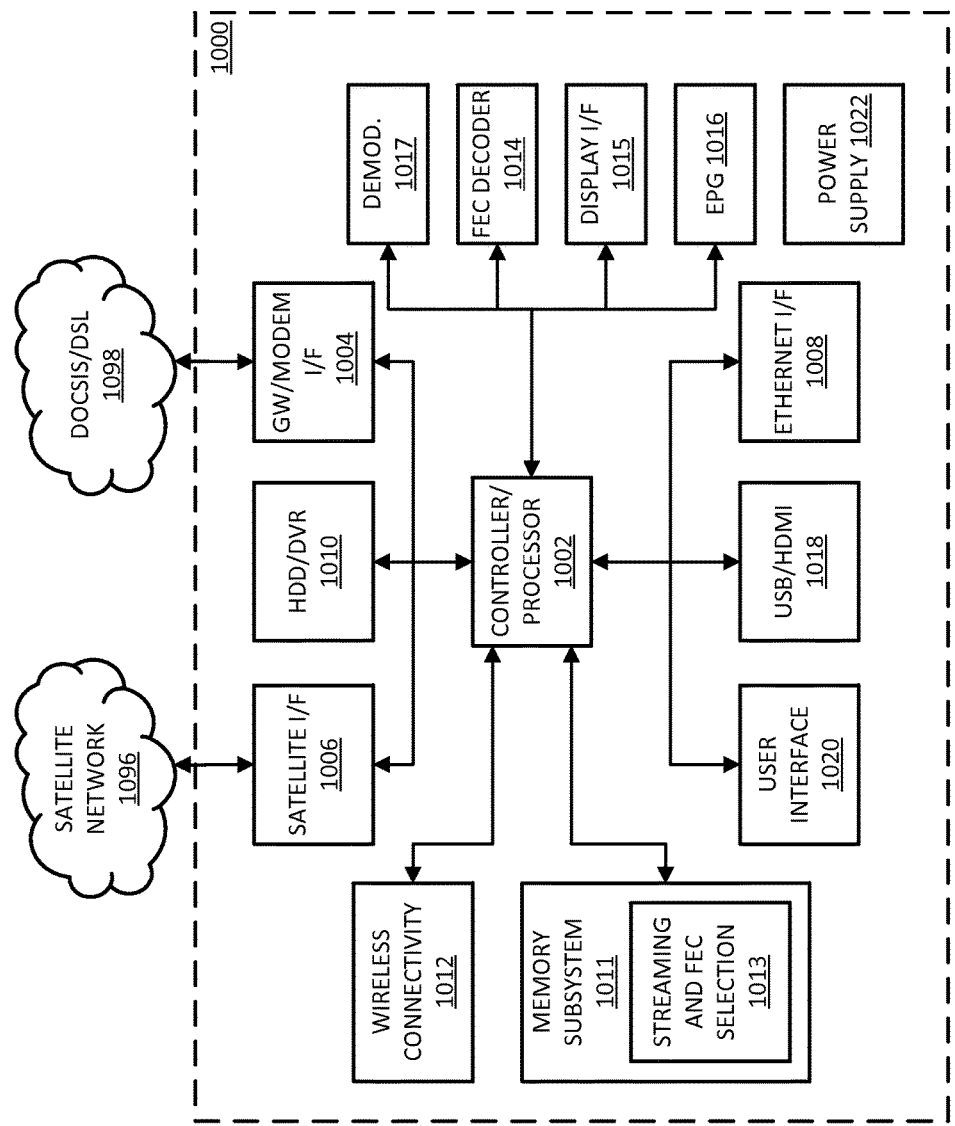
FIG. 10 is a block diagram of an example subscriber station operative for performing FEC selection according to an embodiment of the present patent disclosure.

FIG. 10 is a block diagram of an example subscriber station (e.g., an STB) operative for performing FEC selection according to an embodiment of the present patent disclosure. STB 1000 is generally representative of an ABR client device shown in some of the Figures described above, and may include appropriate hardware/software components and subsystems configured for performing any of the device-side processes (either individually or in any combination thereof) with respect to FEC selection, metadata parsing and FEC request generation for purposes of the present patent application. One or more microcontrollers/processors 1002 are provided for the overall control of the subscriber device 1000 and for the execution of various stored program instructions embodied in a persistent memory 1013, e.g., as a streaming client application having FEC selection capability that may be part of a memory subsystem 1011 of the subscriber device 1000. Controller/processor complex referred to by reference numeral 1002 may also be representative of other specialty processing modules such as graphic processors, video processors, digital signal processors (DSPs), and the like, operating in association with suitable video and audio interfaces (not specifically shown). Appropriate interfaces such as I/F modules 1004 and 1006 involving or operating with tuners, demodulators, descramblers, MPEG/H.264/H.265 decoders/demuxes may be included for processing and interfacing with multicast IPTV and other content signals received via a DSL/CMTS network 1098 or a satellite network 1096 or as an OTT application. Example demodulators 1017 may include NTSC demodulator and/or ATSC/PAL demodulator, and the like. One or more FEC decoders 1014 are operative in conjunction with the streaming client and FEC selection module 1013 for decoding FEC-encoded media data. Other I/O or interfaces such as a display interface 1015, Electronic Program Guide (EPG) 1016 for identifying media service channels, user interface 1020, USB/HDMI ports 1018, Ethernet I/F 1008, and short-range and wide area wireless connectivity interfaces 1012 are also provided. A hard disk drive (HDD) or DVR system 1010 may be included for local storage of all sorts of program assets such as NV media, TV shows, movie titles, multimedia games, etc. Also included in STB 1000 is a suitable power supply block 1022, which may include AC/DC power conversion to provide power for the device 1000. It should be appreciated that the actual power architecture for the subscriber device 1000 may vary by the hardware platform used, e.g., depending upon the core SoC (System-on-Chip), memory, analog front-end, analog signal chain components and interfaces used in the specific platform, and the like.

Figure 11:
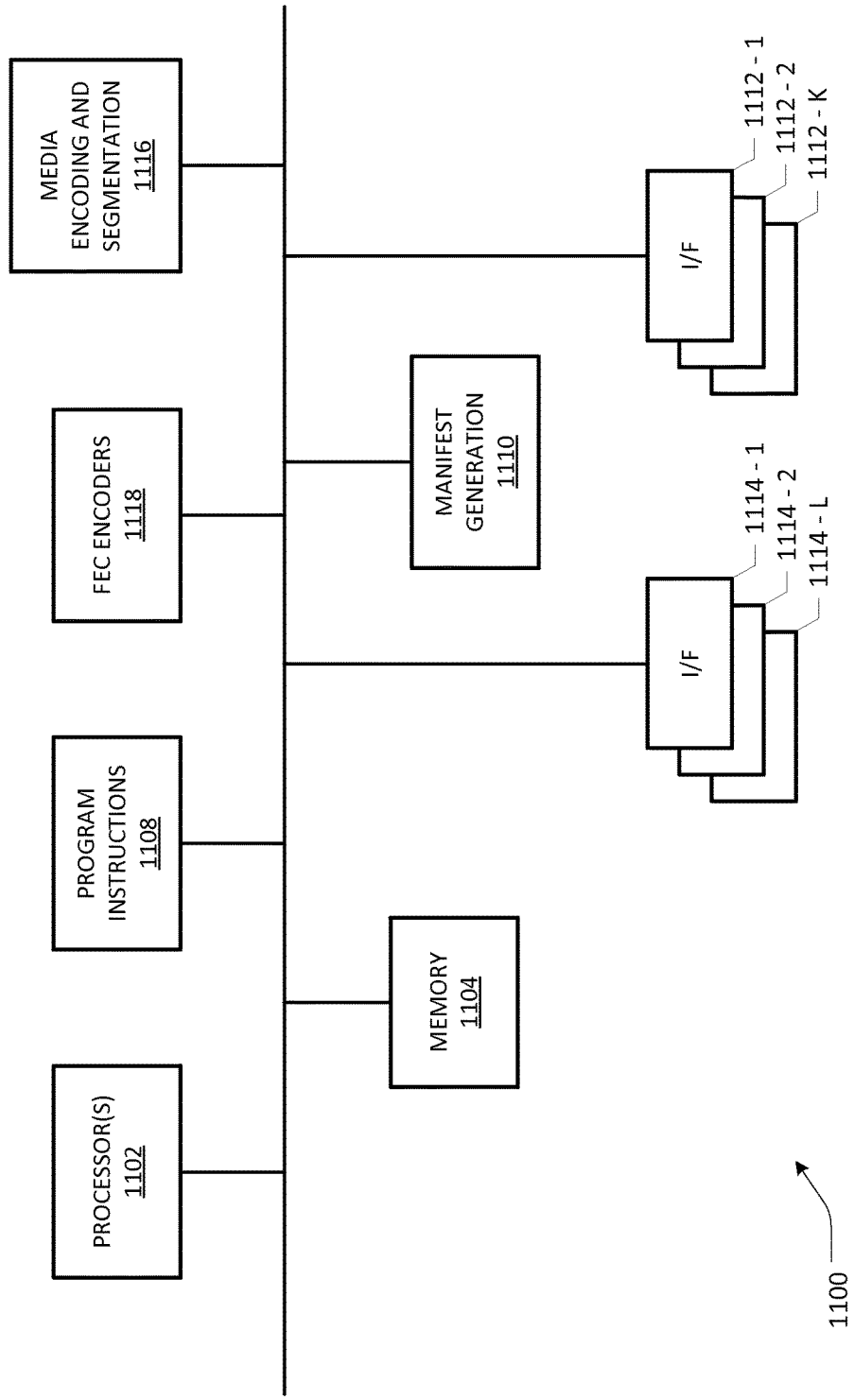
FIG. 11 is a block diagram of an apparatus, subsystem or one or more network components that may be configured as a server node for facilitating client-side FEC selection according to an embodiment of the present patent disclosure.

FIG. 11 is a block diagram of an apparatus, subsystem or one or more network components that may be configured as a server node 1100 for facilitating client-side FEC selection according to an embodiment of the present patent disclosure. Depending on the implementation and/or network architecture of an ABR communications network, apparatus 1100 may be configured in different ways suitable for operation at multiple hierarchical levels, e.g., at a super headend node, regional headend node, video hub office node, ABR origin server node, central or regional or edge distribution node in a CDN, etc., on the basis of where the content sources are disposed. Accordingly, suitable network interfaces, e.g., I/F 1114-1 to 1114-L, operative for effectuating communications with other network infrastructure elements and databases (e.g., source feeds, databases for storing encoded media fragments, FEC fragments, or both, for instance) as well as interfaces 1112-1 to 1112-K for effectuating streaming sessions with one or more subscribers may be provided as part of the network apparatus 1100. One or more processors 1102 may be provided as part of a suitable computer architecture for providing overcall control of the apparatus 1100, which processor(s) 1102 may be configured to execute various program instructions stored in appropriate memory modules or blocks, e.g., persistent memory 1104 as well as program instructions 1108, including additional modules or blocks specific to FEC encoding, media segmentation, etc. By way of illustration, one or more FEC encoder blocks 1118 may comprise suitable hardware and software components for effectuating a variety of FEC configuration settings as discussed previously. A media segmentation and encoding block 1116 is operative to generate multi-bitrate representations of source media, for which suitable metadata files may be generated by a manifest generator 1110. As noted previously, in addition to media segment metadata, FEC fragment metadata is also provided for effectuating an embodiment of the present invention.

Figure 12:
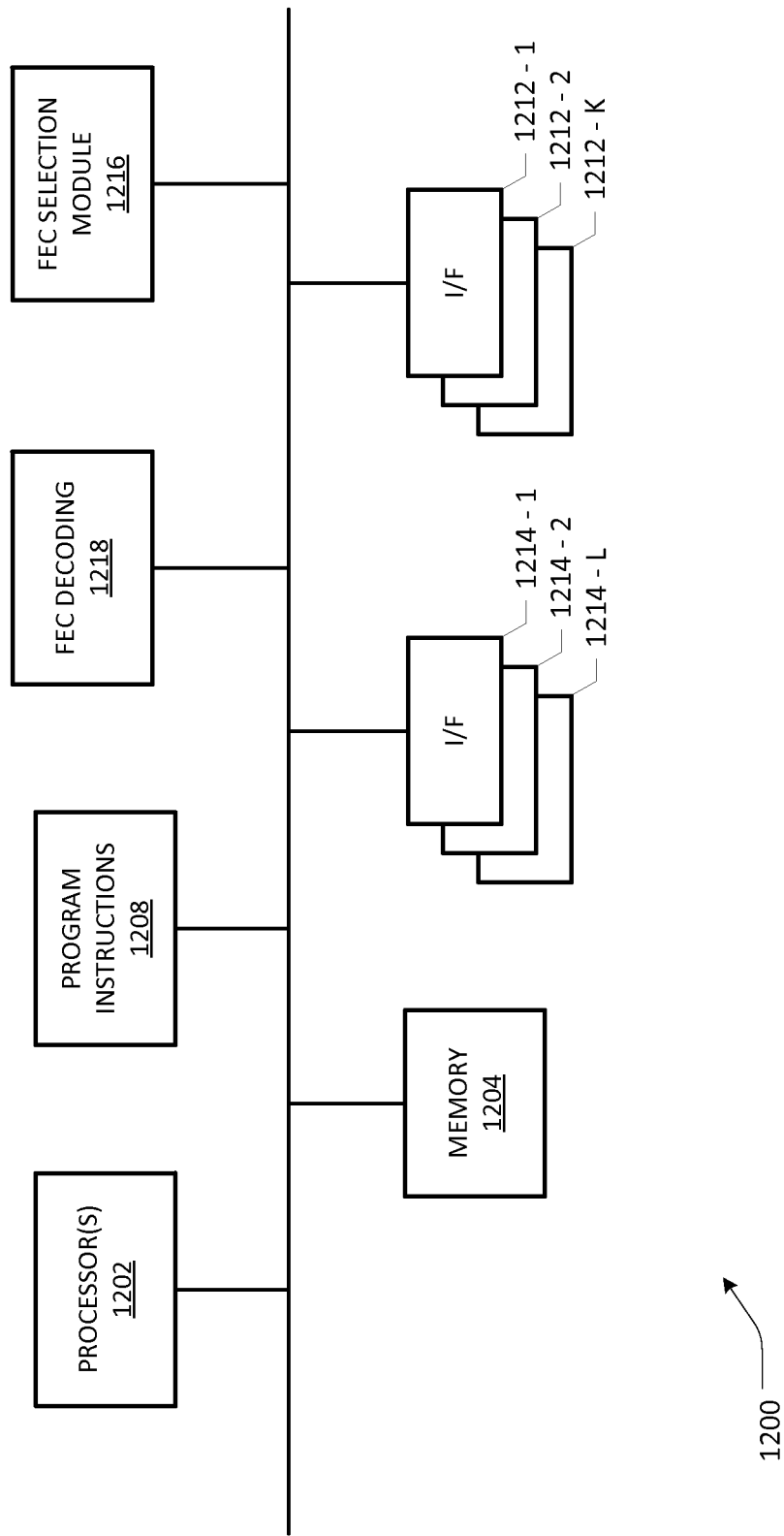
FIG. 12 is a block diagram of an example a gateway node operative for performing FEC selection according to an embodiment of the present patent disclosure.

FIG. 12 is a block diagram of an example a gateway node 1200 operative for performing FEC selection according to an embodiment of the present patent disclosure. One or more processors 1202 may be provided as part of a suitable computer architecture for providing overcall control of the apparatus 1200, which processor(s) 1202 may be configured to execute various program instructions stored in appropriate memory modules or blocks, e.g., persistent memory 1204 as well as program instructions 1208, including additional modules or blocks specific to providing gateway operations relative to applicable network environments, e.g., DOCSIS/CMTS or DSLAM network configurations. Suitable FEC decoder 1218 and FEC selection heuristics module 1216 are also provided to effectuate FEC selection in accordance with the teachings set forth herein. Further, suitable network interfaces, e.g., I/F 1214-1 to 1214-L, operative for effectuating communications with other network infrastructure elements and databases (e.g., toward the network) as well as interfaces 1212-1 to 1212-K for effectuating streaming sessions with one or more subscribers that may be served via a premises network, may be provided as part of the gateway apparatus 1200. One skilled in the will recognize that the example gateway apparatus 1200 may also include additional modules such as bandwidth monitoring and management, IGMP functionality, back office connectivity, etc. to facilitate various operations pertinent to an IPTV application effectuated in an MABR network environment.

One skilled in the art will further recognize that various apparatuses, subsystems, functionalities/applications and/or one or more network elements as well as the underlying network infrastructures set forth above for facilitating an FEC selection scheme may be architected in a virtualized environment according to a network function virtualization (NFV) architecture in additional or alternative embodiments of the present patent disclosure. For instance, various physical resources, databases, services, applications and functions executing within an example network, e.g., network architectures shown in FIGS. 1-3 or FIGS. 9A and 9B, may be provided as virtual appliances, machines or functions, wherein the resources and applications are virtualized into suitable virtual network functions (VNFs) or virtual network elements (VNEs) via a suitable virtualization layer. Resources comprising compute resources, memory resources, and network infrastructure resources are virtualized into corresponding virtual resources wherein virtual compute resources, virtual memory resources and virtual network resources are collectively operative to support a VNF layer, whose overall management and orchestration functionality may be supported by a virtualized infrastructure manager (VIM) in conjunction with a VNF manager and an NFV orchestrator. An Operation Support System (OSS) and/or Business Support System (BSS) component may typically be provided for handling network-level functionalities such as network management, fault management, configuration management, service management, and subscriber management, etc., which may interface with VNF layer and NFV orchestration components via suitable interfaces.

Furthermore, at least a portion of an example network architecture disclosed herein may be virtualized as set forth above and architected in a cloud-computing environment comprising a shared pool of configurable virtual resources. Various pieces of software, e.g., FEC encoding schemes, FEC selection mechanisms, etc., as well as platforms and infrastructure of an ABR network may be implemented in a service-oriented architecture, e.g., Software as a Service (SaaS), Platform as a Service (PaaS), infrastructure as a Service (IaaS) etc., with multiple entities providing different features of an example embodiment of the present invention. Skilled artisans will also appreciate that such a cloud-computing environment may comprise one or more of private clouds, public clouds, hybrid clouds, community clouds, distributed clouds, multiclouds and interclouds (e.g., "cloud of clouds", and the like.

In the above-description of various embodiments of the present disclosure, it is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and may not be interpreted in an idealized or overly formal sense expressly so defined herein.

At least some example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. Such computer program instructions may be provided to a processor circuit of a general purpose computer circuit, special purpose computer circuit, and/or other programmable data processing circuit to produce a machine, so that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s). Additionally, the computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

As alluded to previously, tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray). The computer program instructions may also be loaded onto or otherwise downloaded to a computer and/or other programmable data processing apparatus to cause a series of operational steps to be performed on the computer and/or other programmable apparatus to produce a computer-implemented process. Accordingly, embodiments of the present invention may be embodied in hardware and/or in software (including firmware, resident software, micro-code, etc.) that runs on a processor or controller, which may collectively be referred to as "circuitry," "a module" or variants thereof. Further, an example processing unit may include, by way of illustration, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. As can be appreciated, an example processor unit may employ distributed processing in certain embodiments.

Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts depicted in the drawing Figures of the present disclosure may be modified, altered, replaced, customized or otherwise rearranged within a particular flowchart, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present patent disclosure.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method operating at an adaptive bitrate (ABR) streaming client, the method comprising:
    receiving at the ABR streaming client a manifest file pursuant to streaming of a media asset from a media server, wherein the manifest file includes metadata information relative to a plurality (N) ABR representations of the media asset, each ABR representation comprising a stream of media segments encoded at a particular bitrate, and metadata information relative to forward error correction (FEC) data associated with each segment of each ABR representation of the media asset, wherein each ABR representation of the media asset is associated with a plurality (M) of FEC information fragments generated using each of a plurality of FEC coding schemes;

the ABR streaming client monitoring a plurality of conditions relevant to the streaming of the media asset;

responsive to the monitored plurality of conditions, the ABR streaming client dynamically selecting on a segment by segment basis, a specific combination of a particular ABR representation and a particular FEC information fragment from [N×M] combinations for a media segment, that minimize transmission errors in streaming; and responsive to the dynamic selection, fetching individual media segments of the media asset by the ABR streaming client on a segment by segment basis, wherein the fetching comprises obtaining the specific combination of the particular ABR representation and the particular FEC information fragment corresponding to each media segment, wherein the media asset is streamed by the ABR streaming client for recording at a local video recorder by issuing a plurality of first request messages to obtain the media segments from the media server and followed by a plurality of second request messages issued at a later time after recording the media segments at the local video recorder to fetch the particular FEC information fragments associated with the media segments at playback of the recorded media asset;

wherein the plurality of second request messages are issued to an FEC cache different from a media segment cache, and wherein the FEC information fragments are provided, for each media segment, as separate sets of FEC fragments stored at the FEC cache and the media segments are stored at the media segment cache.

2. The method as recited in claim 1, wherein the plurality (N) ABR representations of the media asset are streamed as multicast ABR (MBAR) streams of a media channel in an IPTV network.

3. The method as recited in claim 1, wherein the manifest file includes resource locators for each of [N×M] combinations with respect to a media segment.

4. The method as recited in claim 1, wherein the plurality of second request messages are generated based on locator information received in the manifest file with respect to the FEC fragments stored at the FEC cache.

5. An adaptive bitrate (ABR) streaming client equipment, comprising:
one or more processors operative to control a metadata parser operative to parse metadata information in a manifest file received pursuant to streaming of a media asset from a media server, wherein the manifest file includes metadata information relative to a plurality (N) ABR representations of the media asset, each ABR representation comprising a stream of media segments encoded at a particular bitrate, and metadata information relative to forward error correction (FEC) data associated with each segment of each ABR representation of the media asset, wherein each ABR representation of the media asset is associated with a plurality (M) of FEC information fragments generated using each of a plurality of FEC coding schemes;

a selection module operating in association with the one or more processors for dynamically selecting on a segment by segment basis, responsive to monitoring a plurality of conditions relevant to the streaming of the media asset, a specific combination of a particular ABR representation and a particular FEC information fragment from [N×M] combinations for a media segment, that minimize transmission errors in streaming;

an ABR streaming client module operating in association with the metadata parser and the selection module for fetching individual media segments of the media asset on a segment by segment basis, responsive to the dynamic selection, wherein the fetching comprises obtaining the specific combination of the particular ABR representation and the particular FEC information fragment corresponding to each media segment; and a local video recorder for recording the media asset streamed by the ABR streaming client module, wherein the ABR streaming client module is operative for recording the media asset at the local video recorder by issuing a plurality of first request messages to obtain the media segments from the media server and followed by a plurality of second request messages issued at a later time after recording the media segments at the local video recorder to fetch the particular FEC information fragments associated with the media segments at playback of the recorded media asset;

wherein the plurality of second request messages are issued to an FEC cache different from a media segment cache, and wherein the FEC information fragments are provided, for each media segment, as separate sets of FEC fragments stored at the FEC cache and the media segments are stored at the media segment cache.

6. The ABR streaming client equipment as recited in claim 5, wherein the manifest file includes resource locators for each of [N×M] combinations with respect to a media segment.

7. The ABR streaming client equipment as recited in claim 5, wherein the plurality of second request messages are generated based on locator information received in the manifest file with respect to the FEC fragments stored at the FEC cache.

* * * * *

UNITED STATES PATENT AND TRADEMARK OFFICE
CERTIFICATE OF CORRECTION

PATENT NO. : 10,498,368 B2  
APPLICATION NO. : 14/930543  
DATED : December 3, 2019  
INVENTOR(S) : Edwin Salomons et al.

Page 1 of 1

It is certified that error appears in the above-identified patent and that said Letters Patent is hereby corrected as shown below:

In the Specification

At Column 5, Line number 40, delete "NV" and replace with --A/V--.
At Column 6, Line number 59, delete "audio/video (AN) content" and replace with --audio/video (A/V) content--.
At Column 17, starting at Line number 18, delete "Ethernet UF 1008" and replace with --Ethernet I/F 1008--.
At Column 17, Line number 22, delete "such as NV media" and replace with --such as A/V media--.

Signed and Sealed this
Third Day of March, 2020

Andrei Iancu
*Director of the United States Patent and Trademark Office*